United States Patent [19]
Shoji

[11] Patent Number: 5,898,328
[45] Date of Patent: Apr. 27, 1999

[54] PLL CIRCUIT HAVING A SWITCHED CHARGE PUMP FOR CHARGING A LOOP FILTER UP OR DOWN AND SIGNAL PROCESSING APPARATUS USING THE SAME

[75] Inventor: Norio Shoji, Kanagawa, Japan

[73] Assignee: Sony Corporation, Japan

[21] Appl. No.: 08/835,988

[22] Filed: Apr. 10, 1997

[30] Foreign Application Priority Data

Apr. 19, 1996 [JP] Japan ................... 8-098108

[51] Int. Cl.⁶ ................... H03K 5/00; H03L 7/00
[52] U.S. Cl. ................... 327/157; 327/151; 327/160; 327/147; 327/156
[58] Field of Search ................... 327/157, 148, 327/156, 147, 160, 151, 150

[56] References Cited

U.S. PATENT DOCUMENTS

| | | | |
|---|---|---|---|
| 4,885,554 | 12/1989 | Wimmer | 327/157 |
| 5,036,216 | 7/1991 | Hohmann | 327/157 |
| 5,144,156 | 9/1992 | Kawasaki | 327/157 |
| 5,208,546 | 5/1993 | Nagaraj | 327/157 |
| 5,475,326 | 12/1995 | Masuda | 327/157 |
| 5,663,688 | 9/1997 | Delmas | 327/156 |

Primary Examiner—Timothy P. Callahan
Assistant Examiner—April Giles
Attorney, Agent, or Firm—Rader, Fishman & Grauer; Ronald P. Kananen

[57] ABSTRACT

The invention provides a PLL circuit which can form a phase difference between input and output signals with a high degree of accuracy without employing a current source for a very weak current and eliminates dependency of the phase difference upon the input signal frequency. In the PLL circuit, phase difference forming current is added within a term of a fixed period to a selected one of charge-up current and charge-down current, selected by a phase comparison circuit, of a charge pump circuit, which charges up or charges down a loop filter under the control of an output signal of a phase comparison circuit, to form a phase difference between input and output signals of the PLL circuit which are to be compared in phase by the phase comparison circuit. The magnitude of the phase difference depends upon and is controlled by a term within which the phase difference forming current.

9 Claims, 8 Drawing Sheets

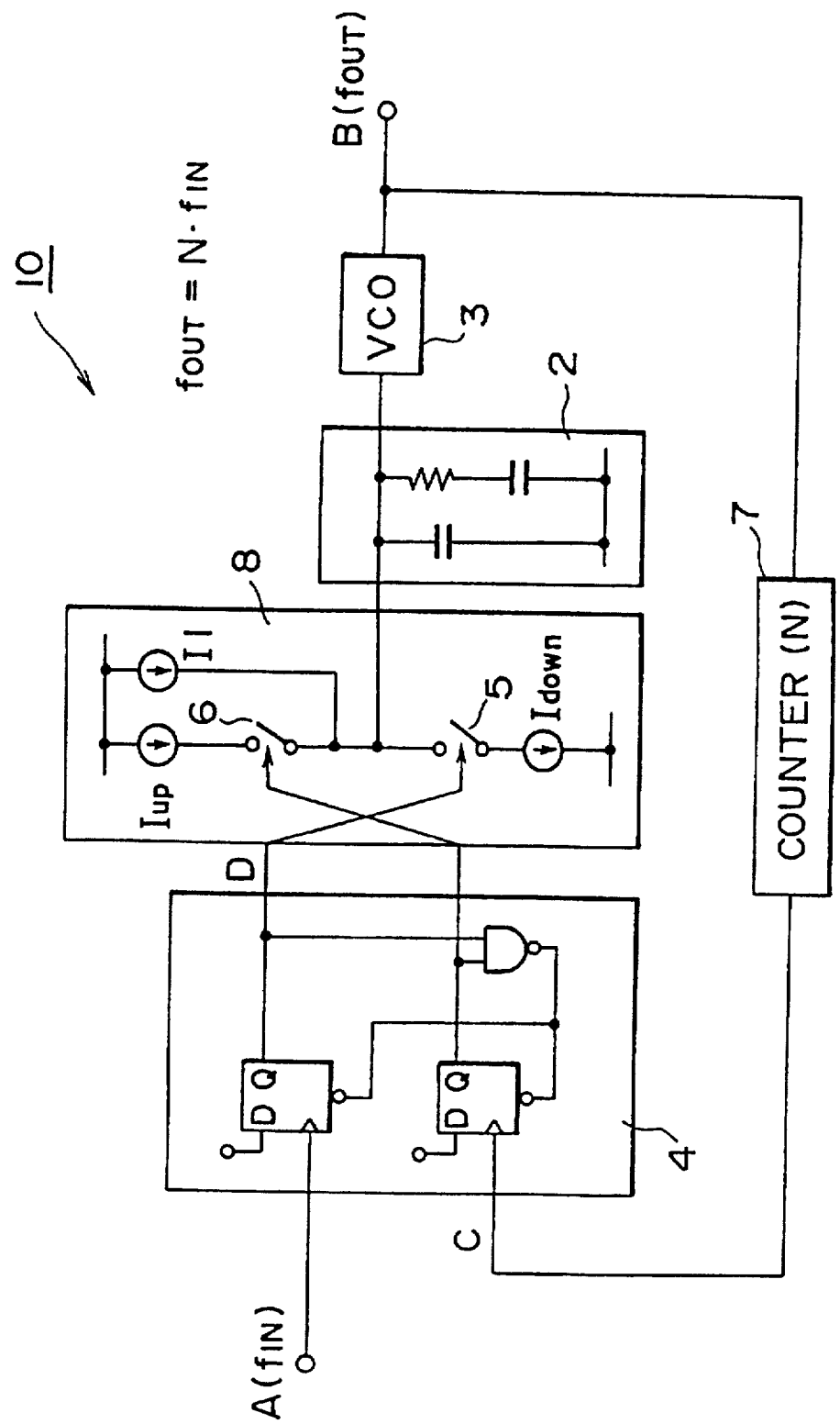
FIG. IA RELATED ART

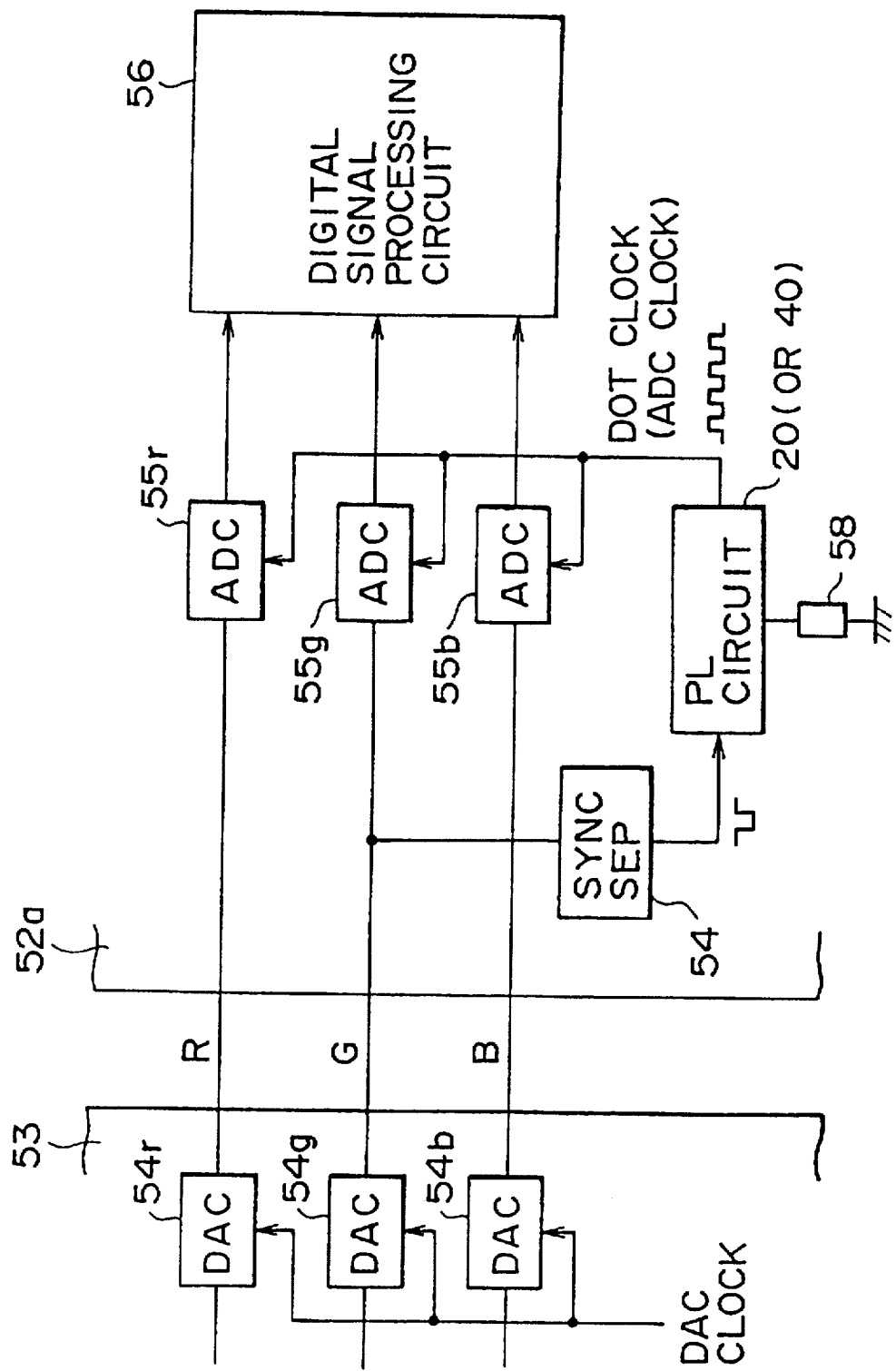

PLL CIRCUIT HAVING A SWITCHED CHARGE PUMP FOR CHARGING A LOOP FILTER UP OR DOWN AND SIGNAL PROCESSING APPARATUS USING THE SAME

BACKGROUND OF THE INVENTION

This invention relates to a PLL circuit, and more particularly to a PLL circuit which can control the phase difference between an input signal and an output signal thereof and a signal processing apparatus using the same.

It is sometimes required for a PLL circuit which produces an output signal of a frequency $f_{out}$ which is N (a positive number such as, for example, 2,000) times the frequency $f_{in}$ of an input signal that it be capable of controlling the phase difference between the input and output signals thereof.

FIGS. 1A to 1C show a PLL circuit as a related art which can form a phase difference between an input signal and an output signal thereof which has some utility, and wherein FIG. 1A is a circuit diagram of the PLL circuit, FIG. 1B is a signal waveform diagram of the PLL circuit of FIG. 1A, and FIG. 1C is a diagram illustrating a principle of production of a phase difference by the PLL circuit of FIG. 1A.

Referring first to FIG. 1A, the PLL circuit is generally denoted at 10 and includes a phase comparison circuit 4 which compares the phases of an input signal (that is, a synchronizing signal Sync) to the PLL circuit 10 with an output signal C of a counter 7 which divides an output signal B (that is, a dot clock signal Dot Clock) of the PLL circuit 10 by 1/N (for example, to 1/2,000).

The PLL circuit 10 further includes a charge pump circuit 8 which in turn includes a charging down current source $I_{down}$, a switch element 5 for connecting the charging down current source $I_{down}$ to a loop filter 2, a charging up current source $I_{up}$, a switch element 6 for connecting the charging up current source $I_{up}$ to the loop filter 2, and a phase difference forming current source I1.

The charging down current source $I_{down}$ discharges a capacitor of the loop filter 2 via the switch element 5, which is controlled by an output signal D of the phase comparison circuit 4. The charging up current source Iup charges the capacitor of the loop filter 2 via the switch element 6, which is controlled by the other output signal of the phase comparison circuit 4. The phase difference forming current source I1 always charges up the loop filter 2.

The PLL circuit 10 further includes a voltage controlled oscillation circuit (VCO) 3 which is controlled by an output of the loop filter 2 to produce a pulse signal of a frequency corresponding to the voltage, that is, a clock pulse signal Dot Clock.

The frequency $f_{out}$ of the output signal B of the PLL circuit 10 depends upon the count value N of the counter 7 and is given by $f_{out}=N.f_{in}$. At a point T2 of time in FIG. 1B, both of the signal B (output signal of the PLL circuit 10) and the signal C (output signal of the counter 7) rise, and the time difference τd between the rising edges of the signals B and C and a rising edge of the input signal A (at another point T1 of time) makes the phase difference between the input and output signals. In an ordinary PLL circuit, the phase difference τd depends upon the current values of the charging up-current source $I_{up}$ and the charging down current source $I_{down}$ and periods within which the switch elements 5 and 6 which pass the currents therethrough are on. However, in the PLL circuit 10 shown in FIG. 1A, since it includes a current source which supplies the source I1 for always charging up on the charge-up side, the charging down current source $I_{down}$ flows so that it may cancel the phase difference forming current source I1.

Accordingly, since phase comparison is performed for each period ($1/f_{in}$) of the input signal A as seen from FIG. 1C, a phase difference τd of $I1/(f_{in}.I_{down})$ is produced, and a locked state is established with the phase difference τd. This is the reason why the phase difference τd is produced.

The PLL circuit having such a construction as described above with reference to FIGS. 1A to 1C has such problems as described below.

In particular, where the PLL circuit 10 is employed for a liquid crystal display apparatus, since the input signal frequency $f_{in}$ is, for example, 70 KHz and the output signal frequency $f_{out}$ is, for example, 140 MHz, if it is tried to set the phase difference τd, for example, to 1 nS (nanosecond), then the current of the phase difference forming current source I1 must be set to a value equal to 1/14,285 the value of the current of the charging down current source $I_{down}$. In other words, the current of the phase difference forming current source I1 must be set to a very low value comparing with the current of the charging down current source $I_{down}$. In the example just mentioned, if $I_{down}$=1 mA, then the current of the phase difference forming current source I1 must be set to I1=0.07 μA.

However, it is really considerably difficult to produce such a weak current with a high degree of accuracy, and accordingly, it is difficult to finely control the phase difference τd.

The PLL circuit is disadvantageous also in that, as apparently seen from the expression $I1/(f_{in}.I_{down})$, the phase difference τd is fluctuated by a variation of the input signal frequency $f_{in}$.

SUMMARY OF THE INVENTION

It is an object of the present invention to provide a PLL circuit which eliminates the necessity for use of a current source for a very weak current to be used for controlling of the phase difference between input and output signals and can control the phase difference with a high degree of accuracy.

It is another object of the present invention to. provide a PLL circuit which eliminates dependency of the phase difference between input and output signals upon the input frequency.

In order to attain the objects described above, according to an aspect of the present invention, there is provided a PLL circuit, wherein phase difference forming current is added within a term of a fixed period to one of charge-up current and charge-down current of a charge pump circuit for charging up or charging down a loop filter under the control of an output signal of a phase comparison circuit to control a phase difference between input and output signals of the PLL circuit which are to be compared in phase by the phase comparison circuit.

With the PLL circuit, since the term within which the phase difference forming current added to one of the charge-up current and the charge-down current controlled by an output of the phase comparison circuit flows is limited to a partial term within each period, the phase difference can be controlled to a ratio of the partial term to the full term of the period. Consequently, a fine phase difference can be obtained with a high degree of accuracy even if the the current value of the added phase difference forming current is not set to a very low value, different from a related art PLL circuit wherein the phase difference is controlled with the added phase difference forming current itself.

Further, the phase difference can be controlled by the length of the term within which the phase difference forming current is added, for example, to the charge-up current with respect to the length of each cycle, and the dependency of the phase difference upon the input signal frequency can be eliminated.

According to another aspect of the present invention, there is provided a signal processing apparatus which converts an analog signal having a synchronizing signal generated after each fixed period into a digital signal by means of an analog to digital converter, comprising a synchronizing signal detection circuit for detecting a synchronizing signal from the analog signal, and the PLL circuit described above for receiving the synchronizing signal and sending out an output signal thereof as an operation control signal to the digital to.

With the signal processing apparatus, a sampling timing at which an analog signal is to be converted into a digital signal can be set or controlled with a high degree of accuracy. Consequently, analog to digital conversion can be performed at an optimum timing, and this allows signal processing which realizes, for example, optimum image reproduction.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 1A to 1C show a PLL circuit which can control the phase difference between input and output signals thereof and wherein FIG. 1A is a circuit diagram of the PLL circuit, FIG. 1B is a signal waveform diagram of the PLL circuit of FIG. 1A, and FIG. 1C is a diagram illustrating a principle of production of a phase difference by the PLL circuit of FIG. 1A;

FIGS. 2A to 2C show a PLL circuit according to a first preferred embodiment of the present invention and wherein FIG. 2A is a circuit diagram of the PLL circuit, FIG. 2B is a signal waveform diagram of the PLL circuit of FIG. 2A, and FIG. 2C is a diagram illustrating a principle of production of a phase difference by the PLL circuit of FIG. 2A;

FIGS. 3A to 3C show a PLL circuit according to a second preferred embodiment of the present invention and wherein FIG. 3A is a circuit diagram of the PLL circuit, FIG. 3B is a signal waveform diagram of the PLL circuit of FIG. 3A, and FIG. 3C is a diagram illustrating a principle of production of a phase difference by the PLL circuit of FIG. 3A; and FIGS. 4A to 4C show a signal processing apparatus of a liquid crystal display apparatus which employs a PLL circuit which can control the phase difference between input and output signals thereof according to a third preferred embodiment of the present invention and wherein FIG. 4A is a block diagram of the signal processing apparatus, FIG. 4B is a signal waveform diagram illustrating a synchronizing signal, a video signal to which the synchronizing signal is added, and a dot clock signal of the signal processing apparatus of FIG. 4A, and FIG. 4C is a waveform diagram showing a digital to analog converter controlling clock signal, an output video signal of a digital to analog converter and the dot clock signal of the signal processing apparatus of FIG. 4A.

DETAILED DESCRIPTION OF THE PREFERRED EMBODIMENTS

Figure 2A:
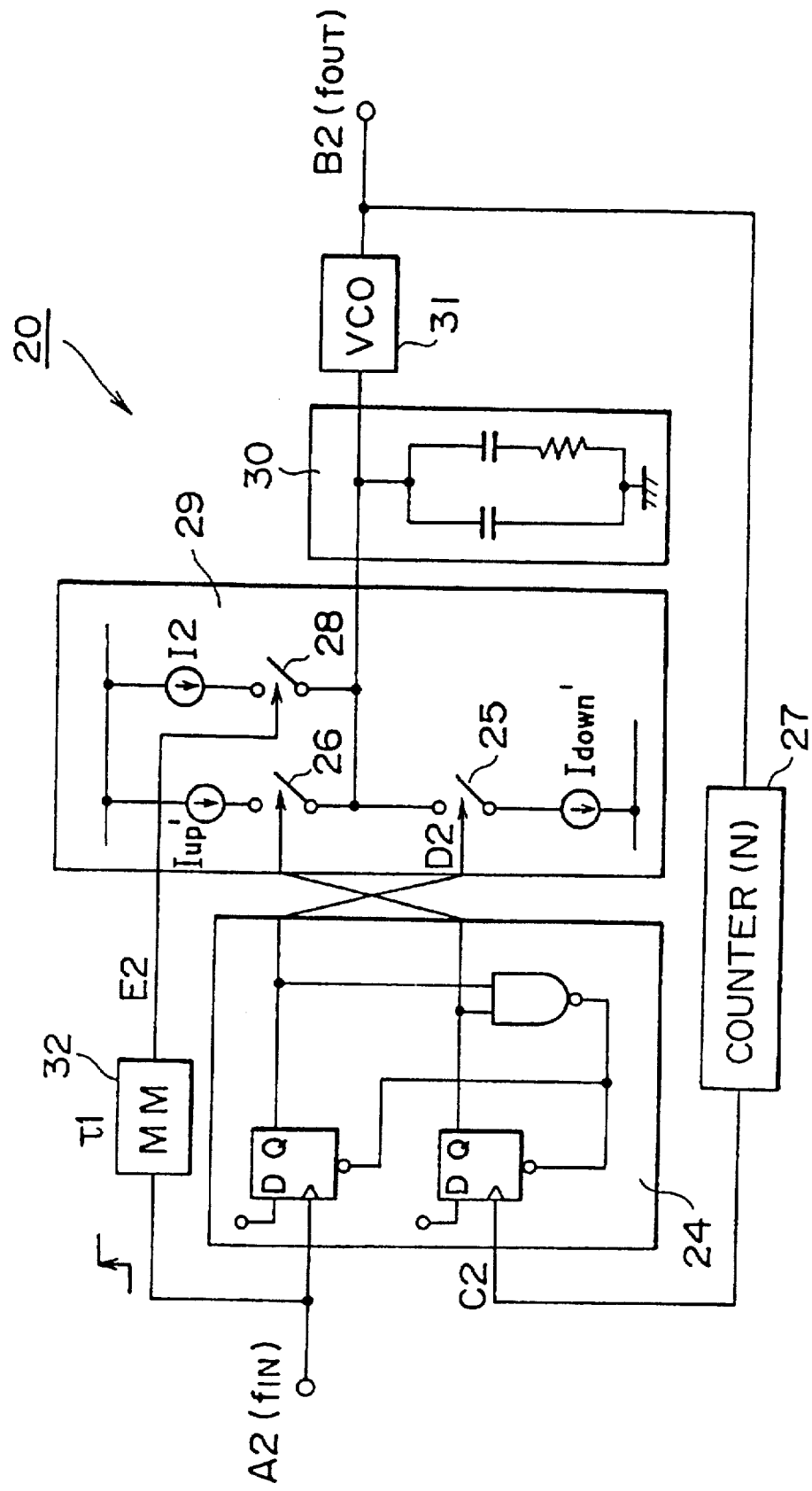
Figure 2B:
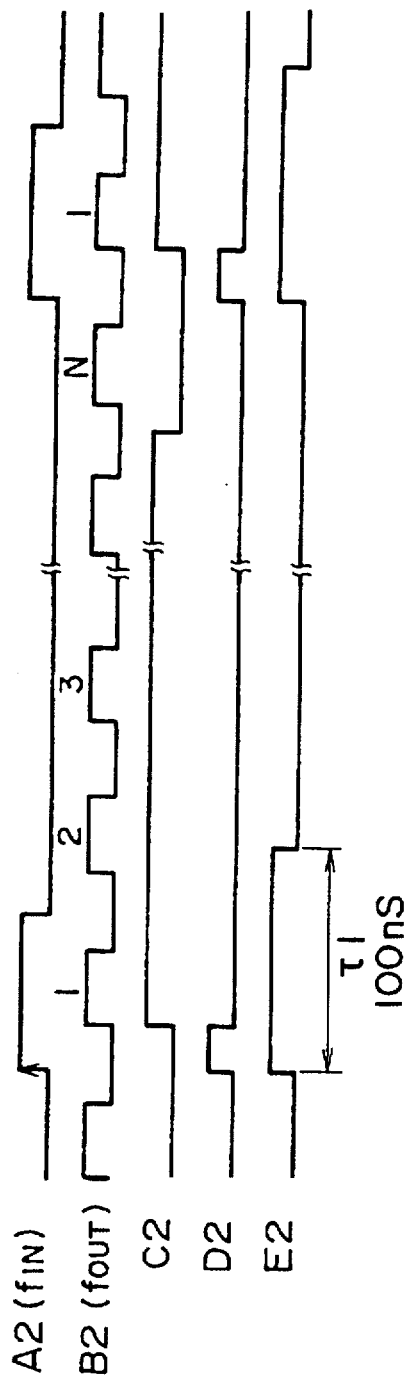
Figure 2C:
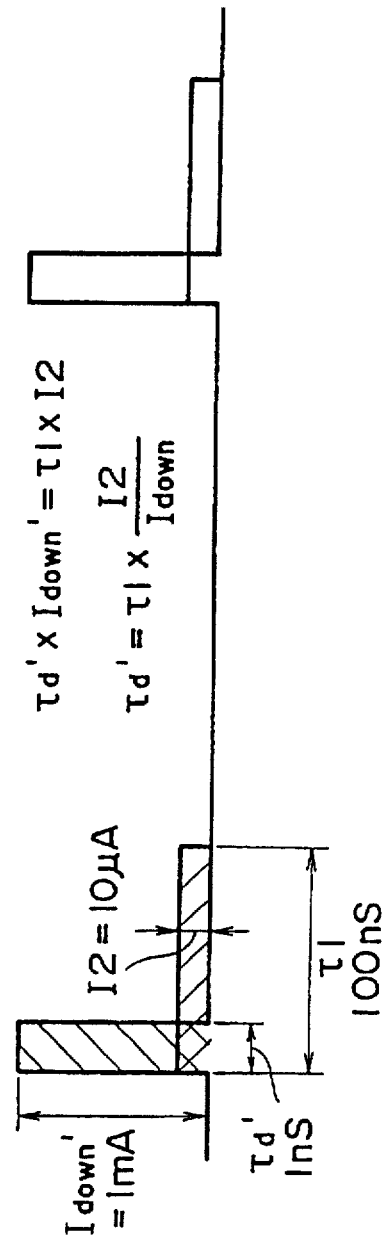

FIGS. 2A to 2C show a PLL circuit according to a first preferred embodiment of the present invention.

Referring first to FIG. 2A, the PLL circuit shown is generally denoted at 20 and includes a phase comparison circuit 24 for comparing an input signal A2 input to the PLL circuit 20 and an output signal C2 of a counter 27 (count value: N) for dividing an output signal B2 of the PLL circuit 20 by 1/N (for example, to 1/2,000).

The PLL circuit 20 further includes a charge pump circuit 29 which in turn includes a current source $I_{down}'$ for charging down a loop filter 30, a switch element 25 for connecting the current source $I_{down}'$ to the loop filter 30, a current source $I_{up}'$ for charging up the loop filter 30, a switch element 26 for connecting the current source Iupf to the loop filter 30, a phase difference forming current source I2 for forming a phase difference by charging up, and a switch element 28 for connecting the phase difference forming current source I2 to the loop filter 30.

The current source $I_{down}'$ discharges a capacitor of the loop filter 30 via the switch element 25, which is controlled by an output signal D2 of the phase comparison circuit 24. The current source $I_{up}'$ charges the loop filter 30 via the switch element 26, which is controlled by the other output signal of the phase comparison circuit 24. The phase difference forming current source I2 charges the loop filter 30 via the switch element 28.

The PLL circuit 20 further includes a monostable multivibrator 32 for controlling the switch element 28. The monostable multivibrator 32 generates one pulse E2 of a pulse width τ1 using a rising edge of a synchronizing signal as a trigger. The switch element 28 is put into an on-state by the pulse E2 so that electric current is supplied from the phase difference forming current source I2 to the loop filter 30.

The PLL circuit 20 further includes a voltage controlled oscillation circuit (VCO) 31 which is controlled by an output voltage of the loop filter 30 and generates a pulse signal of a frequency corresponding to the voltage.

Figure 1B:
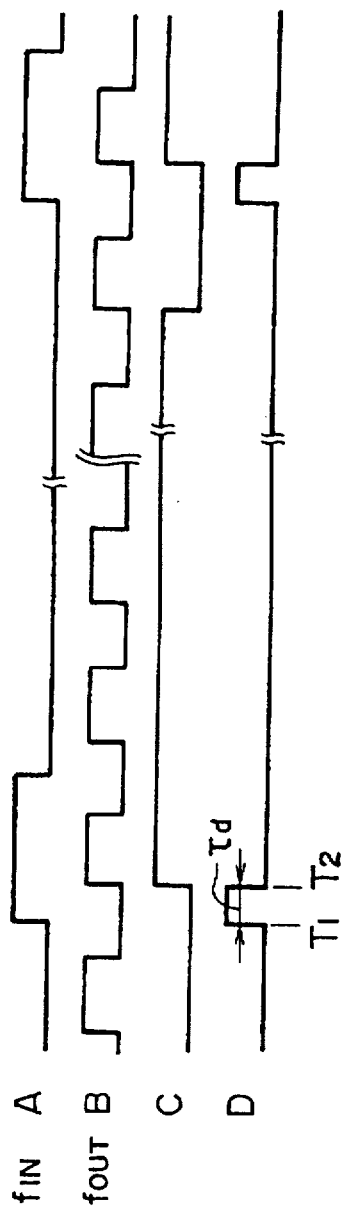
Figure 1C:
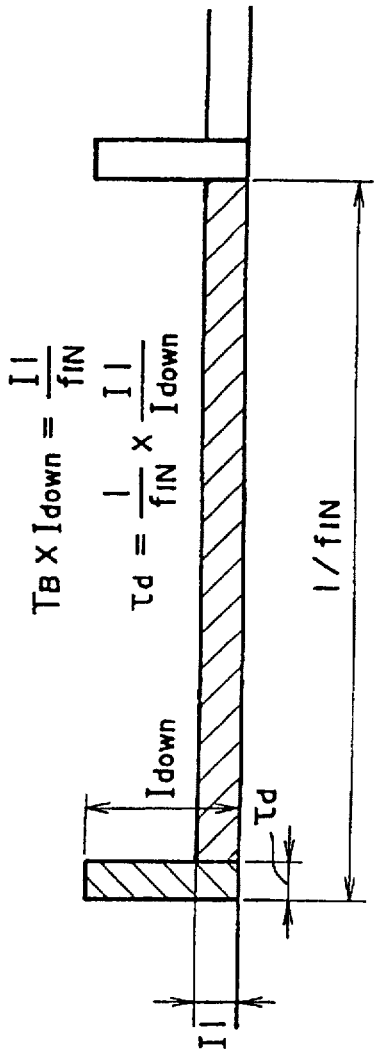

The present PLL circuit 20 is similar to the PLL circuit 10 of FIG. 1A in that the frequency $f_{out}$ of the output signal thereof depends upon the count value N of the counter 27 and $f_{out}=N.f_{in}$. However, the phase difference τd' of the PLL circuit 20 depends upon the pulse width τ1 of the output pulse of the monostable multivibrator 32, the current of the charging up current source $I_{up}'$ and the current of the phase difference forming current source I2 as seen from FIGS. 2B and 2C.

In particular, while, in the PLL circuit 10 shown in FIG. 1A, the phase difference forming current source I1 always flows and the charging down current source $I_{down}$ flows in such a manner as to cancel the phase difference forming current source I1, in the PLL circuit 20 shown in FIG. 2A, the current I2 flows only for the period τ1 within which an output pulse of the monostable multivibrator 32 is produced, and the PLL circuit 20 is kept stably in a locked state at τ1'.$I_{down}'$=I2.τ1. Accordingly, the phase difference τd'=τ1.I2/$I_{down}'$ stands.

Accordingly, if, for example, $I_{down}'$=1 mA, I2=10 µA and τ1=100 nS, then ττd'=1 nS. Then, I2=10 µA can be realized readily (while, in the PLL circuit described in the description of the related art above, I1=0.07 µA must be established, this is difficult to accomplish). Further, it can be accomplish without a problem to set the period τ1 of the output pulse of the monostable multivibrator 32 to 100 nS.

Accordingly, the phase difference between input and output signals can be controlled readily with a high degree of accuracy.

Further, the phase difference τd' depends upon the period τ1 and the forming current source I2, that is, the current of the phase difference forming current source I2 and the current of the charging down current source $I_{down}'$ and is not influenced by the input signal frequency $f_{in}$.

The phase difference τd' between the input and output signals A2 and B2 can be varied by varying the pulse width τ1 of an output pulse of the monostable multivibrator 32 or by varying the current value of the phase difference forming current source I2. Accordingly, the phase difference can be varied by using, for the monostable multivibrator 32, a monostable multivibrator of the pulse width variable type or by using, for the phase difference forming current source, a phase difference forming current source of the current value variable type.

Further, while, in the PLL circuit 20 shown in FIG. 2A, the phase difference forming current source I2 is provided on the charge-up side, it may otherwise be provided on the charge-down side.

Figure 3A:
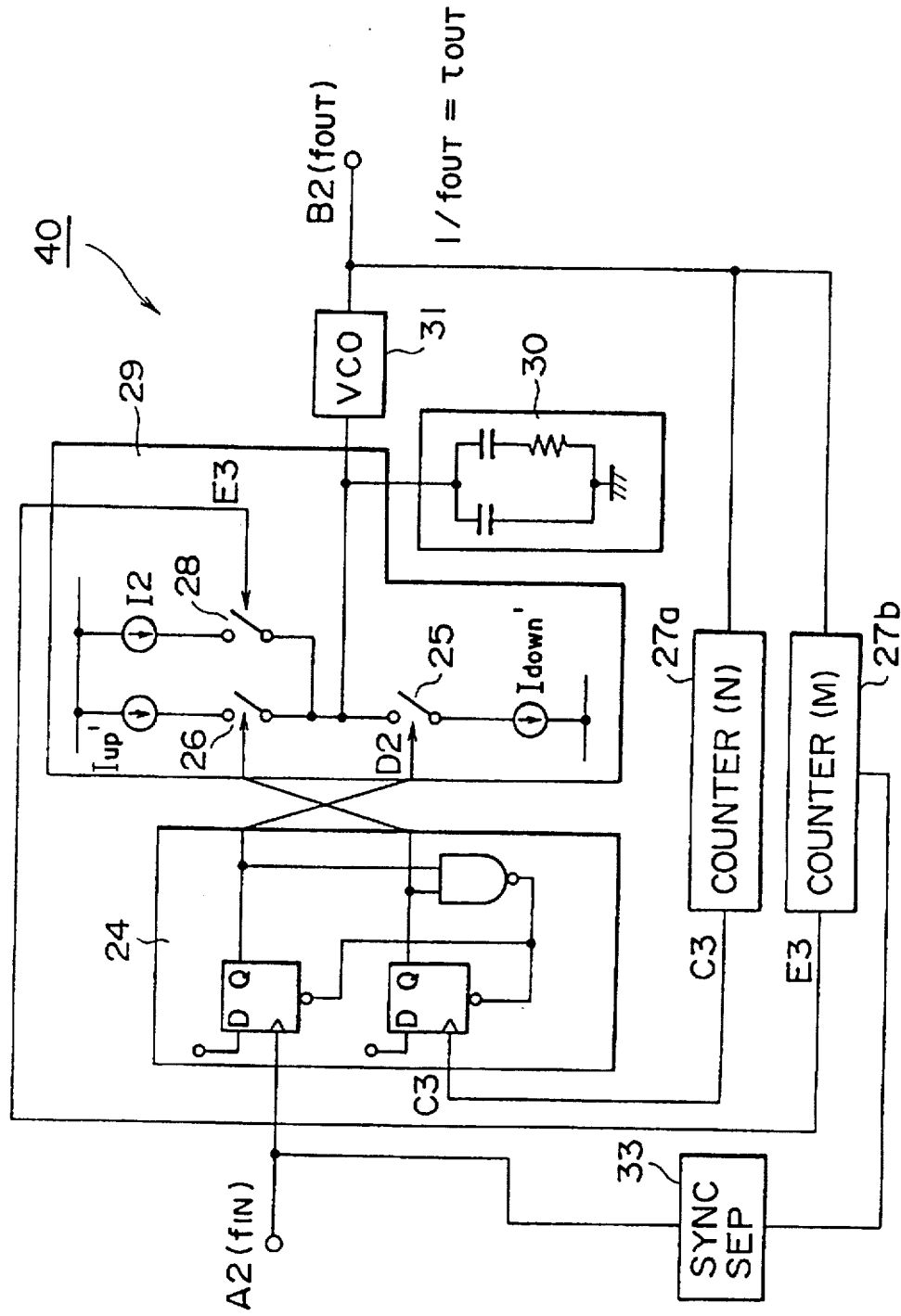
Figure 3B:
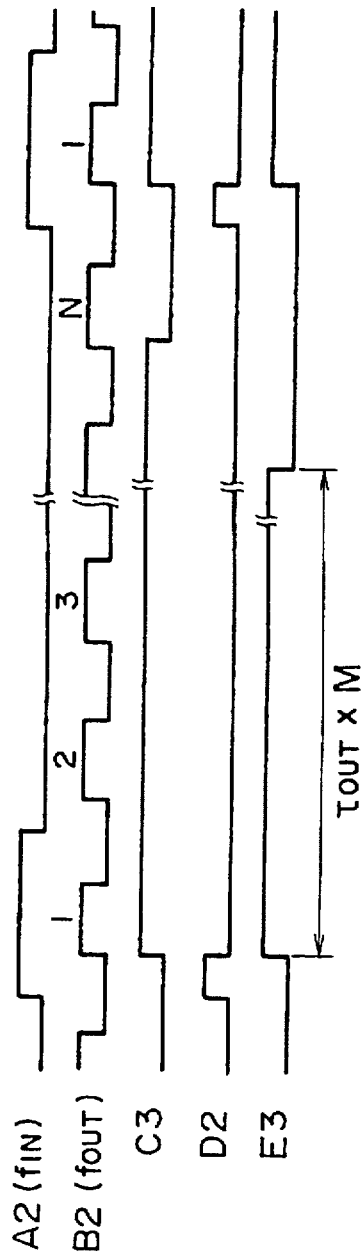
Figure 3C:
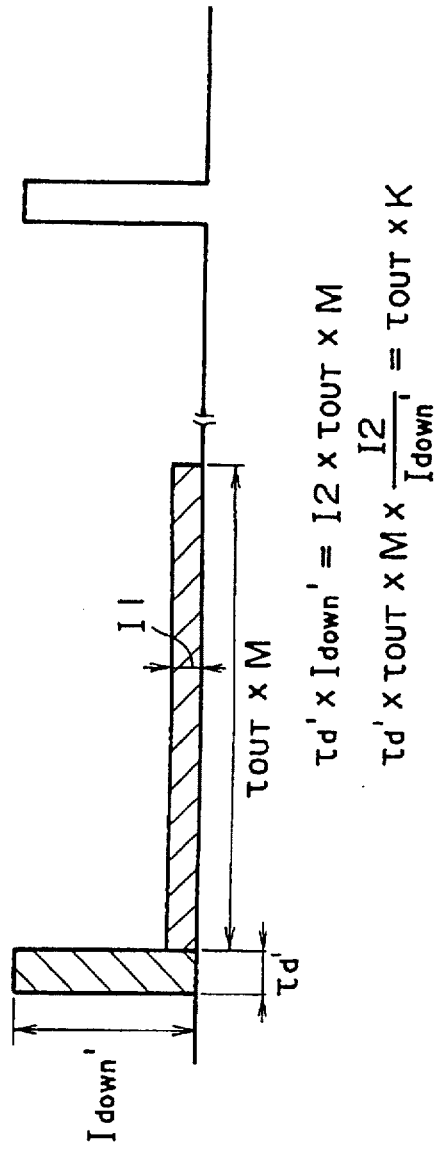

Referring now to FIGS. 3A to 3C, there is shown a PLL circuit according to a second preferred embodiment of the present invention. The PLL circuit shown is generally denoted at 40 and is a modification to and includes common components to those of the PLL circuit 20 described hereinabove with reference to FIGS. 2A to 2C. Overlapping description of the common components is omitted herein to avoid redundancy.

The PLL circuit 40 is different from the PLL circuit 20 in that the switch element 28 for switching the current of the phase difference forming current source I2 is controlled by an output of a counter 27b.

The counter 27b counts the number of pulses of the output signal B2 up to a positive number M, and the switch element 28 is controlled by an output E3 of the counter 27b. A synchronizing signal separator 33 extracts a synchronizing signal Sync from the input signal A2, and an output of the synchronizing signal separator 33 is sent out as a reset signal to the counter 27b.

Also in the PLL circuit 40 of the present embodiment, basically an output signal frequency $f_{out}$ equal to N times the input signal frequency fan is obtained, and within a period within which the switch element 28 remains on, the current from the phase difference forming current source I2 is added to the current from the charging up current source $I_{up}'$. Thus, the PLL circuit of the present embodiment is similar in operation to the PLL circuit shown in FIG. 2A. However, since the counter 27b which controls the switch element 28 counts the output signal B2, the switch element 28 turns on after a delay of τd' from a rising edge of the input signal A2 in each cycle. Then, the on duration is given by $\tau_{out}·M$ where $t_{out}$ is the period of the output signal B2 and $\tau_{out}=1/f_{out}$.

Accordingly, the phase difference τd' is represented by the following expression:

$$\tau d'=\tau_{out}·M·I2/I_{down}'$$

Here, if $K=M·I2/I_{down}'$, then $\tau d'=T_{out}·K$. Thus, the phase difference τd' is always equal to K times the output signal period $\tau_{out}$.

Accordingly, if, for example, $I_{down}'=1$ mA, I2=10 μA and M=10, then K=0.1, and if $\tau_{out}=7$ nS, then τd'=0.7 nS is realized with a high degree of accuracy. Further, since it is very easy to set the current ratio between the currents of the phase difference forming current source I2 and the charging down current source $I_{down}'$ to approximately 1:10 and M is the count value of the counter 27b, the phase difference τd' can be controlled very accurately in units of $\tau_{out}(=1/f_{out})$ by varying the count value M. Naturally, the phase difference τd can be controlled with a very fine step which cannot be achieved by a PLL circuit of the type wherein the phase difference between an input and an output is produced by a variable delay line inserted in a PLL loop.

Further, since the phase difference τd' increases in proportion to the output signal period $T_{out}$, even where the input signal frequency $f_{in}$ is variable or the output signal frequency $f_{out}$ is variable, a specification of the phase difference τd' wherein the phase difference τd' is presented in a ratio to the output signal period $T_{out}$ such as in percent can be set. The fact that it is possible to set such a specification is very convenient for a liquid crystal display unit which operates with a plurality of synchronizing signals. This is because there is an advantage that, even if the input frequency changes by a reproduction mode (format), it is possible to prevent a change of the ratio between times preceding to and following a sampling timing in each cycle because the phase difference τd' changes in proportion to the input signal frequency.

It is to be noted that, while the phase difference forming current source I2 is provided on the charge-up side, it may be provided otherwise on the charge-down side similarly as in the PLL circuit shown in FIG. 2A.

Figure 4B:
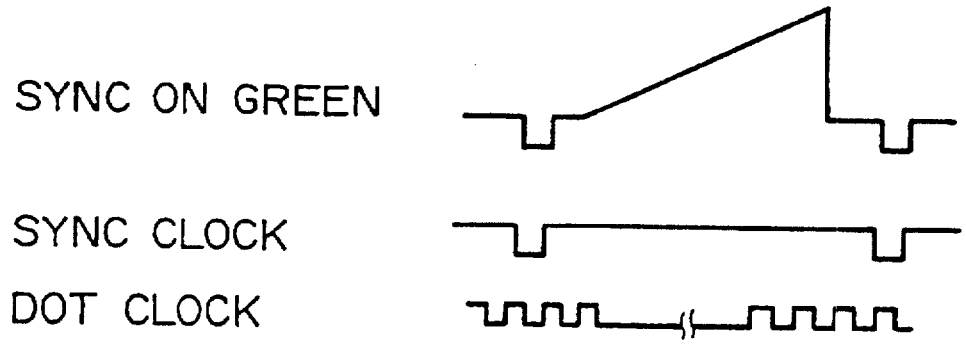

Referring now to FIG. 4, there is shown in block diagram a liquid crystal display apparatus which employs the PLL circuit 20 or 40 described hereinabove with reference to FIGS. 2A to 2C or 3A to 3C.

The liquid crystal display apparatus is generally denoted at 52a and connected to an apparatus 53 such as, for example, a personal computer. The apparatus 53 includes digital to analog (D/A) converters 54r, 54g and 54b for converting digital video signals into analog signals R, G and B, respectively. The analog video signals R, G and B are outputted from the apparatus 53 to the liquid crystal display apparatus 52a.

The liquid crystal display apparatus 52a which receives the analog video signals R, G and B includes a synchronizing signal separator 54 which extracts a synchronizing signal (horizontal synchronizing signal) from the analog video signal G. The PLL circuit 20 (or 40) receives the synchronizing signal from the synchronizing signal separator 54 and produces a dot clock signal Dot Clock having a frequency equal to N (for example, 2,000) times that of the synchronizing signal. The dot clock signal Dot Clock is used to control analog to digital (A/D) converters 55r, 55g and 55b. Then, the video signals having been converted into digital signals by the analog to digital converters 55r, 55g and 55b are processed by a digital signal processing circuit 56 and applied to liquid crystal elements not shown.

The frequency of the dot clock signal Dot Clock is different depending upon the resolution of the liquid crystal apparatus and, where the liquid crystal apparatus is VGA, SVGA, XGA or SXGA, the frequency depends upon the numbers of vertical pixels and horizontal pixels as seen from Table 1. For example, in the case of an SXGA liquid crystal monitor, where the synchronizing signal is 76.8 KHz, the frequency of the dot clock signal Dot Clock must be set to 126 MHz. Relationships between representative synchronizing signal frequencies and dot clock signals Dot Clock are listed in Table 1.

CONVERSION RATE
CONVERSION RATE (CLOCK FREQUENCY f) OF THE INTERLACE TYPE DISPLAY IS EQUAL TO f = VERTICAL PIXEL NO. × HORIZONTAL PIXEL NO. × FRAME FREQUENCY/0.75
TO BECOME THE MAIN-STREAM INTERLACE TYPE GRAPHIC DISPLAY XGA (1024 × 768 DISPLAY AND FRAME FREQUENCY IS 72 Hz), ITS CLOCK FREQUENCY IS CALCULATED AS f = 1024 × 768 × 72/0.75 = 75 MHz

|  | VERTICAL (DOT) | HORIZONTAL (LINE) | FRAME FREQUENCY (Hz) | DOT CLOCK FREQUENCY (MHz) | REPRESENTATIVE SYNC FREQUENCY (KH$_z$) |
| --- | --- | --- | --- | --- | --- |
| VGA | 640 | 480 | 72 | 29 | 31.47 |
| SVGA | 800 | 600 | 72 | 46 | 37.00 |
| XGA | 1024 | 768 | 72 | 75 | 56.50 |
| SXGA | 1280 | 1024 | 72 | 126 | 76.80 |

Figure 4C:
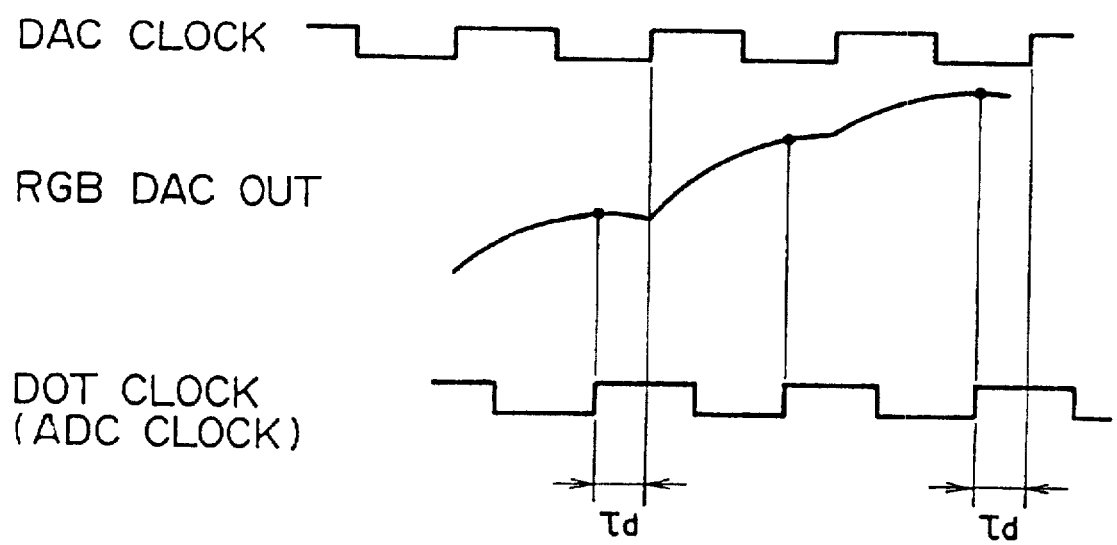

By the way, the analog video signals R, G and B outputted from the apparatus 53 are subject to rounding in accordance with the performance of the digital to analog converters 54r, 54g and 54b in the apparatus 53 as seen from FIG. 4C. Accordingly, the sampling timing must be optimized. Since the sampling timing depends upon the phase difference between the synchronizing signal Sync and the dot clock signal Dot Clock which is an output pulse signal of the PLL circuit 20 (or 40) which controls sampling of the analog to digital converters 55r, 55g and 55b, the phase of the dot clock signal Dot Clock must be adjustable. This is the reason why a PLL circuit (20 or 40) which can control the phase difference between an input and an output thereof is required.

The required phase difference is as small as several nS.

The present liquid crystal display apparatus 52a is characterized in that it employs, for the PLL circuit 20 (or 40) shown in FIG. 4A, the PLL circuit 20 or 40 shown in FIG. 2A or 3A as a PLL circuit.

The liquid crystal display apparatus 52a further includes an adjustment element 58 for adjusting the phase difference between input and output signals. The adjustment element 58 can vary, for example, by a manual operation thereof, the pulse width τ1 of the monostable multivibrator 32 or the current value of the phase difference forming current source I2 in the PLL circuit 20 shown in FIG. 2A or the count value M of the counter 27b or the current value of the phase difference forming current source I2 in the PLL circuit 40 shown in FIG. 3A.

Accordingly, a user can manually operate, while observing a reproduced image on a screen of the liquid crystal display unit, the adjustment element 58 so that a possible most clear image can be obtained to adjust the sampling timing of the analog to digital converters 55r, 55g and 55b to an optimum timing. Thus, picture quality adjustment upon switching of a reproduction mode (format) can be performed readily with certainty.

With the PLL circuit of the present invention, since a period within which phase difference forming current added to one of charge-up current and charge-down current controlled by an output of a phase comparison circuit flows is limited to a partial period within each cycle, the phase difference can be controlled to a ratio of the partial period to the full period of the cycle. Consequently, a fine phase difference can be obtained with a high degree of accuracy even if the the current value of the added phase difference forming current is not set to a very low value, different from a conventional PLL circuit wherein the phase difference is controlled with the added phase difference forming current itself.

Further, the phase difference can be controlled by the length of a period within which the phase difference forming current is added, for example, to the charge-up current with respect to the length of each cycle, and the dependency of the phase difference upon the input frequency can be eliminated.

Further, with the signal processing apparatus of the present invention, a sampling timing at which an analog signal is to be converted into a digital signal can be set or controlled with a high degree of accuracy. Consequently, analog to digital conversion can be performed at an optimum timing, and this allows signal processing which realizes, for example, optimum image reproduction.

Having now fully described the invention, it will be apparent to one of ordinary skill in the art that many changes and modifications can be made thereto without departing from the spirit and scope of the invention as set forth herein.

What is claimed is:

1. A PLL circuit, comprising:

a phase comparator for comparing phases of an input signal and a comparison signal with each other;

a first control signal generation circuit for receiving the input signal to generate a first control signal;

a charge pump circuit including a first current source and a second current source which are controlled by an output signal of said phase comparator and a third current source which is controlled by a second control signal;

a voltage controlled oscillation circuit having an oscillation frequency controlled by an output signal of said charge pump circuit;

a first counter for counting an output signal of said voltage controlled oscillation circuit and applying a resulting count thereof as the comparison signal to said phase comparator; and a second counter for counting an output signal of said voltage controlled oscillation circuit in response to the first control signal to generate the second control signal.

2. The PLL circuit according to claim 1, wherein said first and third current sources are connected in parallel to each other.

3. The PLL circuit according to claim 2, wherein a current value of said third current source is set lower than a current value of said first current source.

4. The PLL circuit according to claim 3, wherein a conducting period of said third current source is set longer than a conducting period of said first current source.

5. The PLL circuit according to claim 1, wherein said first control signal generation circuit includes a synchronizing signal generation circuit.

6. The PLL circuit according to claim 1, wherein said charge pump further includes switching means for connecting said third current source with either one of said first current source and second current source such that a current from said third current source is added to a current from either one of said first current source and second current source within a term of a fixed period.

7. The PLL circuit according to claim 6, wherein said switching means is controlled by said second control signal from said second counter which counts the output signal of said PLL circuit up to a number corresponding to a phase difference to be formed.

8. The PLL circuit according to claim 6, wherein said switching means is cleared by a synchronizing signal from the input signal to said PLL circuit.

9. A signal processing apparatus which converts an analog signal having a synchronizing signal generated after each fixed period into a digital signal by means of an analog to digital converter, comprising:

- a synchronizing signal detection circuit for detecting a synchronizing signal from the analog signal; and
- a PLL circuit for receiving the synchronizing signal and sending out an output signal thereof as an operation control signal to said digital to analog converter, said PLL circuit including,
- a phase comparator for comparing phases of an input signal and a comparison signal with each other,
- a first control signal generation circuit for receiving the input signal to generate a first control signal,
- a charge pump circuit including a first current source and a second current source which are controlled by an output signal of said comparator and a third current source which is controlled by a second control signal,
- a voltage controlled oscillation circuit having an oscillation frequency controlled by an output signal of said charge pump circuit,
- a first counter for counting an output signal of said voltage controlled oscillation circuit and applying a resulting count thereof as the comparison signal to said phase comparator, and
- a second counter for counting an output signal of said voltage controlled oscillation circuit in response to the first control signal to generate the second control signal.

* * * * *

UNITED STATES PATENT AND TRADEMARK OFFICE
CERTIFICATE OF CORRECTION

PATENT NO. : 5,898,328
DATED : April 27, 1999
INVENTOR(S) : Norio SHOJI

It is certified that error appears in the above-identified patent and that said Letters Patent is hereby corrected as shown below:

Claim 1 should read:

1. A PLL circuit, comprising:

a phase comparator for comparing phases of an input signal and a comparison signal with each other;

a first control signal generation circuit for receiving the input signal to generate a first control signal;

a charge pump circuit including a first current source and a second current source which are controlled by an output signal of said comparator and a third current source which is controlled by a second control signal;

a voltage controlled oscillation circuit having an oscillation frequency controlled by an output signal of said charge pump circuit;

UNITED STATES PATENT AND TRADEMARK OFFICE
CERTIFICATE OF CORRECTION

PATENT NO. : 5,898,328
DATED : April 27, 1999
INVENTOR(S) : Norio Shoji

It is certified that error appears in the above-indentified patent and that said Letters Patent is hereby corrected as shown below:

a first counter for counting an output signal of said voltage controlled oscillation circuit and applying a resulting count thereof as the comparison signal to said phase comparator; and a second counter for counting an output signal of said voltage controlled oscillation circuit in response to the first control signal to generate the second control signal.

Signed and Sealed this

Sixteenth Day of November, 1999

Attest:

Attesting Officer

Q. TODD DICKINSON

Acting Commissioner of Patents and Trademarks